United States Patent
Saucedo-Flores

(10) Patent No.: US 7,205,583 B1
(45) Date of Patent: Apr. 17, 2007

(54) THYRISTOR AND METHOD OF MANUFACTURE

(75) Inventor: Emmanuel Saucedo-Flores, Zapopan (MX)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/317,213

(22) Filed: Dec. 22, 2005

(51) Int. Cl.
*H01L 29/74* (2006.01)
*H01L 21/332* (2006.01)

(52) U.S. Cl. ............... 257/155; 257/175; 257/E29.046; 257/E27.052; 438/133

(58) Field of Classification Search .............. 257/155, 257/175; 438/133
See application file for complete search history.

(56) References Cited

U.S. PATENT DOCUMENTS

| | | | |
|---|---|---|---|
| 5,281,832 A | 1/1994 | Clark et al. | |
| 5,483,087 A | 1/1996 | Ajit | |
| 5,610,434 A | 3/1997 | Brogle et al. | |
| 5,629,535 A | 5/1997 | Ajit | |
| 6,965,131 B2 | 11/2005 | Chang | |

OTHER PUBLICATIONS

Fundamental Characteristics of Thyristors, Thyristor Product Catalog, AN1001-1 to -5. Copyrighted 2004. Retrieved from www.littelfuse.com.
Gating, Latching, and Holding of SCRs and Triacs Product Catalog, AN1002-1 to -5. Copyrighted 2004. Retrieved from www.littelfuse.com.

*Primary Examiner*—Evan Pert
(74) *Attorney, Agent, or Firm*—Rennie W. Dover

(57) ABSTRACT

A thyristor and a method for manufacturing the thyristor that includes providing a semiconductor substrate that has first and second major surfaces. A first doped region is formed in the semiconductor substrate, wherein the first doped extends from the first major surface into the semiconductor substrate. The first doped region has a vertical boundary that has a notched portion. A second doped region is formed in first doped region, wherein the second doped region extends from the first major surface into the first doped region. A third doped region is formed in the semiconductor substrate, wherein the third doped region extends from the second major surface into the semiconductor substrate.

22 Claims, 5 Drawing Sheets

THYRISTOR AND METHOD OF MANUFACTURE

FIELD OF THE INVENTION

The present invention relates, in general, to semiconductor components and, more particularly, to thyristors.

BACKGROUND OF THE INVENTION

A thyristor is a semiconductor device used as a switch in power control applications. Typically, thyristors are comprised of multiple layers of P-type semiconductor material and N-type semiconductor material. Various types of thyristors include, among others, triacs, silicon controlled rectifiers (SCRs), sidacs, and diacs. These devices differ from each other in the number of layers of P-type and N-type semiconductor material and in the number of terminals. For example, a triac is a five layer semiconductor device that has three terminals, a silicon controlled rectifier (SCR) is a four layer semiconductor device that has three terminals, a sidac is a five layer semiconductor device that has two terminals, and a diac is a three layer semiconductor device that has two terminals. Because of the configuration of the P-type and N-type semiconductor materials, thyristors are comprised of a plurality of PN junctions. Each PN junction has a small junction capacitance associated with it. When a voltage is applied across the thyristor, a charging current, $I_C$, flows through the junction. The amount of current $I_C$ is given by Equation 1 as:

$$I_C = C*(dv/dt) \qquad \text{Equation 1}$$

where:

$I_C$ is the charging current in amperes;

C is the junction capacitance in Farads; and dv/dt is a measure of the switching capability.

The thyristor switches on when the current $I_C$ equals or exceeds the thyristor trigger current $I_{GT}$. To protect against fast rising voltages, semiconductor component manufacturers typically include protection circuitry with the thyristor. The protection circuitry adds to the cost of the thyristor and limits the temperature range over which the thyristor can effectively operate.

Another drawback with thyristors is that they may have an unbalanced trigger current, $I_{GT}$. Although trigger current unbalancing is exacerbated in thyristors made from thicker wafers, the use of thicker wafers is advantageous because they increase the blocking voltage ratings of the thyristor.

Hence, a need exists for a thyristor having an improved switching capability with a balanced triggering current. Further, it would be advantageous for the thyristor to be cost efficient to manufacture.

BRIEF DESCRIPTION OF THE DRAWINGS

The present invention will be better understood from a reading of the following detailed description taken in conjunction with the accompanying drawing figures in which like reference characters designate like elements and in which.

DETAILED DESCRIPTION

Generally, the present invention provides a thyristor having a balanced triggering current and improved commutation immunity and a method for manufacturing the thyristor. The present invention is suitable for use in the manufacture of various types of thyristors including triacs, silicon controlled rectifiers (SCRs), sidacs, diacs, etc. An advantage of manufacturing triacs in accordance with the present invention is that it permits gating the triac in any of the four gating modes of operation. As those skilled in the art are aware, a triac can be biased in one of up to four bias configurations or gating modes. In all gating modes the top cathode (also referred to as main terminal I) is at ground potential. In a first gating mode, the bottom cathode (also called an anode or main terminal II) and the gate electrode are biased with voltages that have a positive polarity, i.e., the bottom cathode and the gate electrode are biased with voltages of the same polarity and it is a positive polarity. It should be understood that when an electrode is biased with a voltage having a positive polarity, it is positively biased and when an electrode is biased with a voltage having a negative polarity it is negatively biased. In a second gating mode, the bottom electrode is positively biased and the gate electrode is negatively biased. In a third gating mode, the bottom cathode and gate electrode are negatively biased, i.e., the bottom cathode and the gate electrode are biased with voltages of the same polarity and it is a negative polarity. In a fourth gating mode, the bottom cathode is negatively biased and the gate electrode is positively biased so that the anode terminal and the gate terminal are biased with voltages of opposite polarity. Operating the thyristor in the first, second, third, and fourth gating modes is also referred to as operating in the first, second, third, and fourth quadrants, respectively. Operating a triac in the third or the fourth quadrants requires higher triggering currents as compared to operating a triac in the first or second quadrants. A figure of merit of a triac is the balance between its triggering currents when operating in the different operating modes, i.e., the uniformity in the sensitivity of the triggering currents in all quadrants. Optimum device diffusion processes and pattern designs are desirable for properly balancing the triggering currents in the first, second, third, and fourth quadrants. For example, it is desirable for the triggering currents in the third and fourth quadrants to match those of the first and second quadrants.

Figure 1:
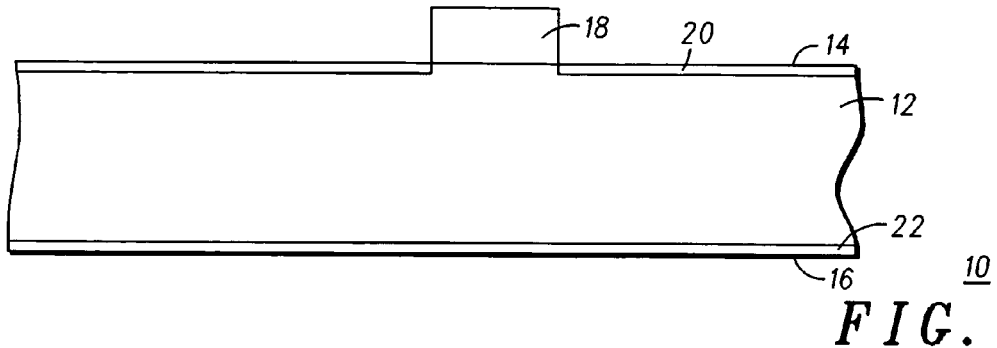
FIG. 1 is a cross-sectional side view of a thyristor at an early stage of manufacture in accordance with an embodiment of the present invention.

FIG. 1 is a cross-sectional side view of a thyristor 10 at an early stage of manufacture in accordance with an embodiment of the present invention. What is shown in FIG. 1 is a semiconductor substrate 12 having surfaces 14 and 16. Semiconductor substrate 12 has a thickness ranging from approximately 170 micrometers (7 mils) to approximately 350 micrometers (14 mils). Preferably, semiconductor substrate 12 has a thickness of approximately 230 micrometers (9 mils). In accordance with one embodiment, semiconductor substrate 12 is doped with an impurity material or dopant of N-type conductivity and has a dopant concentration ranging from approximately $5 \times 10^{13}$ atoms per cubic centimeter (atoms/cm$^3$) to approximately $3 \times 10^{14}$ atoms/cm$^3$. Suitable dopants of N-type conductivity include phosphorus and arsenic. It should be noted that the type of impurity material and the conductivity type of the impurity material of semiconductor substrate 12 are not limitations of the present invention. Alternatively, semiconductor substrate 12 can be doped with an impurity material of P-type conductivity. It should be understood that when semiconductor substrate 12 is doped with an impurity material of P-type conductivity, the doped regions described hereinbelow would be of the opposite conductivity type and the biasing conditions described hereinabove would be of the opposite sign.

A dielectric layer is formed on surface 14 and patterned using photolithographic techniques to form a dopant blocking mask 18. An impurity material of P-type conductivity is deposited on the exposed portions of surface 14 and on surface 16 to form predeposition layers 20 and 22. Predeposition layer 20 extends from surface 14 into semiconductor substrate 12 and predeposition layer 22 extends from surface 16 into semiconductor substrate 12. By way of example, the impurity material is boron and is deposited to have a resistivity ranging from approximately 14 Ohms per square ($\Omega$/square) to approximately 400 $\Omega$/square. Suitable sources of boron include boron trichloride, diborane, or the like.

Figure 2:
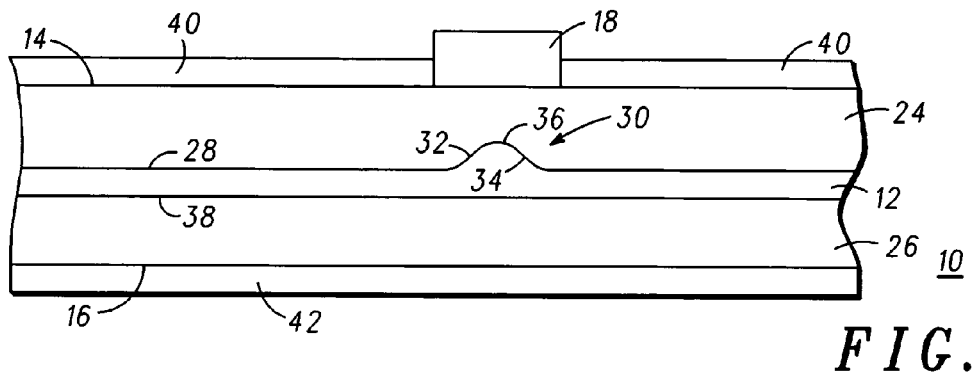
FIG. 2 is a cross-sectional side view of the thyristor of FIG. 1 at a later stage of manufacture.

Referring now to FIG. 2, the impurity material of predeposition layers 20 and 22 is driven into semiconductor substrate 12 to form doped regions 24 and 26. The drive-in is performed for a time ranging from approximately 20 hours to approximately 40 hours at a temperature ranging from approximately 1,100 degrees Celsius (° C.) to approximately 1,270° C. Doped region 24 extends from surface 14 into semiconductor substrate 12 and doped region 26 extends from surface 16 into semiconductor substrate 12. Doped region 24 includes a portion having a vertical boundary 28 that has a notch 30, which notch 30 has lateral boundaries 32 and 34 and a vertical boundary 36. The distance from surface 14 to vertical boundary 28 is greater than the distance from surface 14 to vertical boundary 36 of notch 30. Notch 30 arises because impurity material or dopant is not deposited on the portion of surface 14 under or protected by doping mask 18. Notch 30 is formed when the portions of predeposition layer 20 on opposing sides of etch mask 18 laterally and vertically diffuse and overlap while driving the dopant into semiconductor substrate 12. Doped region 26 has a vertical boundary 38.

In accordance with one embodiment, driving-in the impurity material of predeposition layers 20 and 22 thermally oxidizes surfaces 14 and 16 and forms oxide layers 40 and 42. Thermally oxidizing surfaces 14 and 16 typically reshapes doping mask 18. Alternatively, doping mask 18 and any oxide that may have formed on surfaces 14 and 16 may be removed and dielectric layers 40 and 42 may be formed on surfaces 14 and 16, respectively. Techniques for the alternative method of forming dielectric layers 40 and 42 include thermal oxidation, chemical vapor deposition, sputtering, etc. By way of example, dielectric layers 40 and 42 are oxide.

Figure 3:
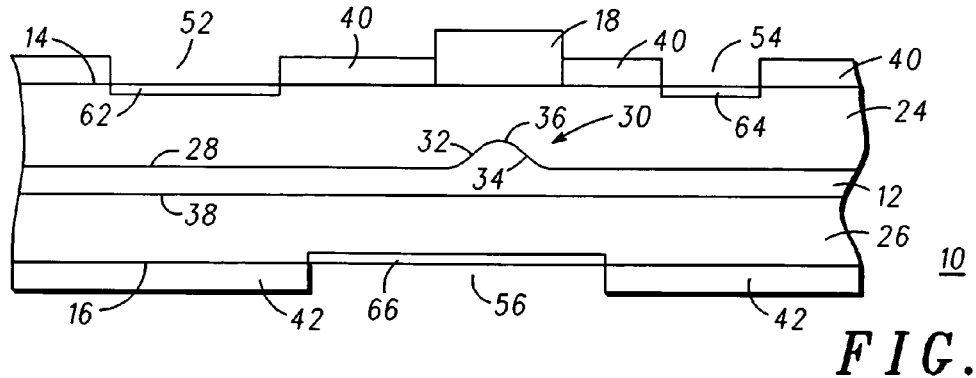
FIG. 3 is a cross-sectional side view of the thyristor of FIG. 2 at a later stage of manufacture.

Referring now to FIG. 3, dielectric layer 40 is patterned to have openings 52 and 54, and dielectric layer 42 is patterned to have an opening 56. An impurity material of P-type conductivity is deposited on the portions of surfaces 14 and 16 exposed by opening 52, 54, and 56 to form predeposition layers 62, 64, and 66, respectively. By way of example, the impurity material is boron and is deposited to have a resistivity ranging from approximately 0.3 $\Omega$/square to approximately 2 $\Omega$/square. Suitable sources of boron include boron trichloride, diborane, or the like.

Figure 4:
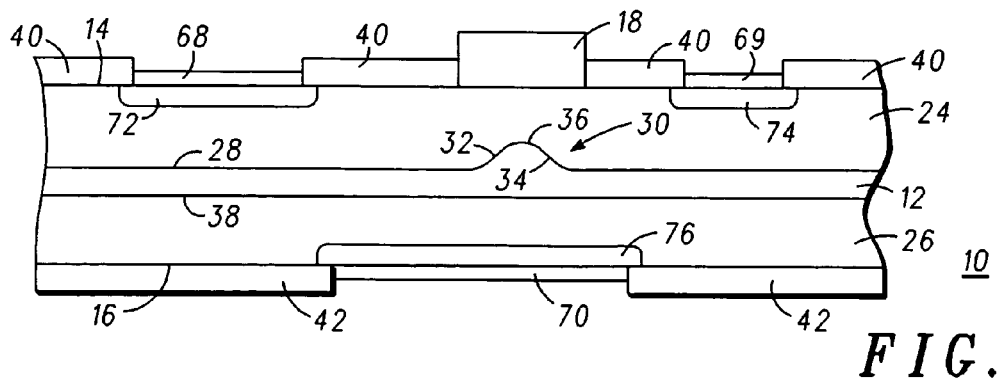
FIG. 4 is a cross-sectional side view of the thyristor of FIG. 3 at a later stage of manufacture.

Referring now to FIG. 4, the impurity material disposed on the exposed portions of surfaces 14 and 16 is driven into semiconductor substrate 12 to form doped regions 72, 74, and 76. The drive-in is performed for a time ranging from approximately 2 hours to approximately 6 hours at a temperature ranging from approximately 1,200° C. to approximately 1,270° C. Doped regions 72 and 74 extend from surface 14 into semiconductor substrate 12 and doped region 76 extends from surface 16 into semiconductor substrate 12. Doped region 72 serves as a cathode region of thyristor 10 and doped region 74 serves as a gate region of thyristor 10.

In accordance with one embodiment, driving-in the impurity material of predeposition layers 62, 64, and 66 thermally oxidizes surfaces 14 and 16 and forms oxide layers 68, 69, and 70.

Figure 5:
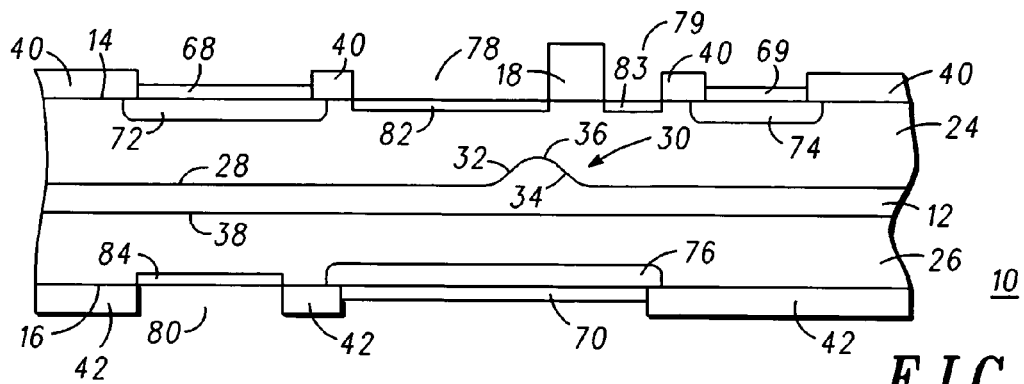
FIG. 5 is a cross-sectional side view of the thyristor of FIG. 4 at a later stage of manufacture.

Referring now to FIG. 5, portions of dielectric layer 40 between doping mask 18 and doped region 72 and between doping mask 18 and doped region 74 are removed to form openings 78 and 79, respectively, that expose portions of surface 14. A portion of dopant blocking mask 18 proximal to doped region 72 may also be removed. In addition, a portion of dielectric layer 42 adjacent doped region 76 and below doped region 72 is removed to form an opening 80 that exposes a portion of surface 16. An impurity material of N-type conductivity is deposited on the portions of surfaces 14 and 16 exposed by openings 78, 79, and 80 to form predeposition layers 82, 83, and 84, respectively. By way of example, the impurity material is phosphorus or a phosphorus containing material that is deposited to have a resistivity ranging from approximately 0.3 $\Omega$/square to approximately 2 $\Omega$/square. Suitable sources of phosphorus include phosphorus oxytrichloride (POCl$_3$), phosphine (PH$_3$), phosphorus penta-oxide, or the like.

Figure 6:
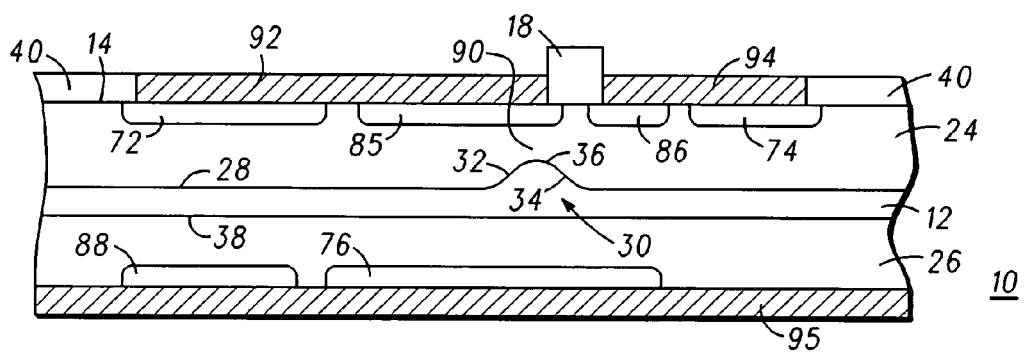
FIG. 6 is a cross-sectional side view of the thyristor of FIG. 5 at a later stage of manufacture.

Referring now to FIG. 6, the impurity material disposed on the exposed portions of surfaces 14 and 16 is driven into semiconductor substrate 12 to form doped regions 85, 86, and 88, wherein doped region 86 is laterally spaced apart from doped region 85. The drive-in is performed for a time ranging from approximately 2 hours to approximately 6 hours at a temperature ranging from approximately 1,200° C. to approximately 1,270° C. Doped regions 85 and 86 extend from surface 14 into semiconductor substrate 12 and doped region 88 extends from surface 16 into semiconductor substrate 12. Oxide layers 68 and 69 and a portion of dielectric layer 40 over doped regions 72 and 85 are removed from surface 14. Oxide layer 42 is removed from surface 16.

Electrical contacts are made to doped regions 72, 85, 74, 86, 76, and 88. More particularly, a top cathode contact 92 is formed in contact with doped regions 72 and 85, a gate contact 94 is formed in contact with doped regions 74 and 86, and a bottom cathode contact 95 is formed in contact with bottom doped regions 76 and 88. Techniques for forming openings in dielectric material and forming electrical contacts are known to those skilled in the art.

An advantage of thyristor 10 is that it provides a means to localize highly sensitive triggering spots. For example, notch 30 is vertically adjacent doped region 85 and cooperates with doped region 85 to form a gain-enhanced site or region 90. Region 90 locally boosts the gain of the NPN transistor formed between doped regions 24 and 85. This feature helps to create SCR's with faster turn-on (low Igt) and faster turn-off (high IH).

Figure 7:
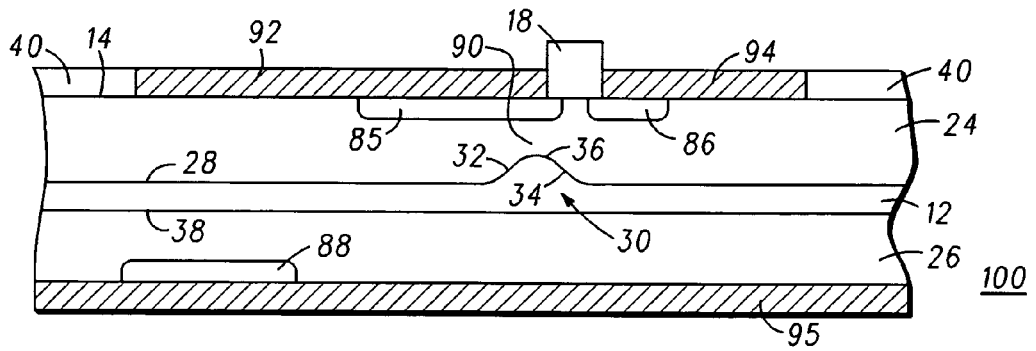
FIG. 7 is a cross-sectional side view of a thyristor during manufacture in accordance with another embodiment of the present invention.

FIG. 7 is a cross-sectional side view of a thyristor 100 in accordance with another embodiment of the present invention. Thyristor 100 is like thyristor 10 except that predeposition layers 62, 64, and 66 shown and described with reference to FIG. 3 are not formed. Thus, doped regions are not formed 72, 74, and 76 are not formed in thyristor 95.

Figure 8:
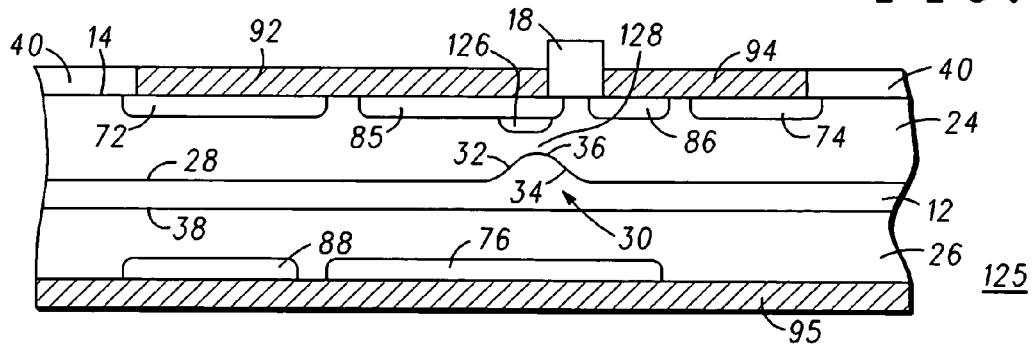
FIG. 8 is a cross-sectional side view of a thyristor during manufacture in accordance with yet another embodiment of the present invention.

FIG. 8 is a cross-sectional side view of a thyristor 125 in accordance with another embodiment of the present invention. Thyristor 125 is similar to thyristor 10 except that it includes an extension region 126 of N-type conductivity extending from doped region 85 into doped region 24. Thus, notch 30 cooperates with doped region 85 and extension region 126 to form a gain-enhanced site or region 128 that locally boosts the gain of the NPN transistor formed from substrate 12, doped regions 24 and 85, and extension region 126.

Figure 9:
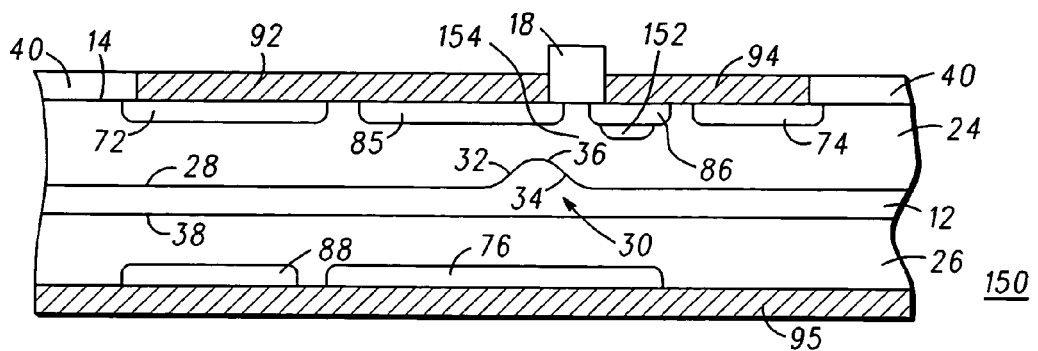
FIG. 9 is a cross-sectional side view of a thyristor during manufacture in accordance with yet another embodiment of the present invention.

FIG. 9 is a cross-sectional side view of a thyristor 150 in accordance with another embodiment of the present invention. Thyristor 150 is similar to thyristor 10 except that it includes an extension region 152 of N-type conductivity extending from doped region 86 into doped region 24. Thus, notch 30 cooperates with doped region 86 and extension region 152 to form a gain-enhanced site or region 154 that locally boosts the gain of the NPN transistor formed from substrate 12, doped regions 24 and 86, and extension region 152.

Figure 10:
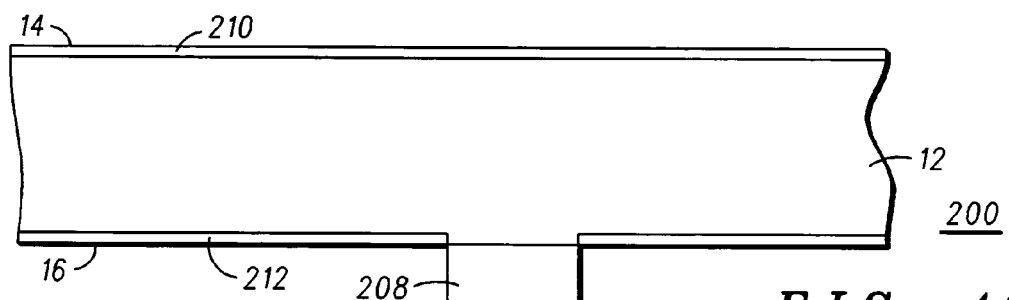
FIG. 10 is a cross-sectional side view of a thyristor at an early stage of manufacture in accordance with yet another embodiment of the present invention.

FIG. 10 is a cross-sectional side view of a thyristor 200 at an early stage of manufacture in accordance with another embodiment of the present invention. What is shown in FIG. 10 is a semiconductor substrate 12 having surfaces 14 and 16. Semiconductor substrate 12 was described with reference to FIG. 1. A dielectric layer is formed on surface 16 and patterned using photolithographic techniques to form a dopant blocking mask 208. An impurity material of P-type conductivity is deposited on surface 14 and on the exposed portions of surface 16 to form predeposition layers 210 and 212. Predeposition layer 210 extends from surface 14 into semiconductor substrate 12 and predeposition layer 212 extends from surface 16 into semiconductor substrate 12. By way of example, the impurity material is boron and is deposited to have a resistivity ranging from approximately 14 Ohms per square ($\Omega$/square) to approximately 400 $\Omega$/square. Suitable sources of boron include boron trichloride, diborane, or the like.

Figure 11:
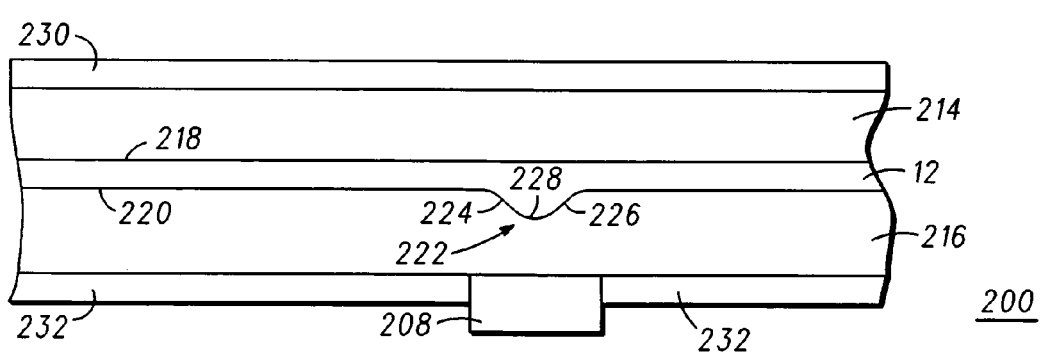
FIG. 11 is a cross-sectional side view of the thyristor of FIG. 10 at a later stage of manufacture.

Referring now to FIG. 11, the impurity material of predeposition layers 210 and 212 is driven into semiconductor substrate 12 to form doped regions 214 and 216. The drive-in is performed for a time ranging from approximately 20 hours to approximately 40 hours at a temperature ranging from approximately 1,100° C. to approximately 1,270° C. Doped region 214 extends from surface 14 into semiconductor substrate 12 and doped region 216 extends from surface 16 into semiconductor substrate 12. Doped region 214 has a vertical boundary 218. Doped region 216 includes a portion having a vertical boundary 220 that has a notch 222, which notch 222 has lateral boundaries 224 and 226 and a vertical boundary 228. The distance from surface 16 to vertical boundary 220 is greater than the distance from surface 16 to vertical boundary 228 of notch 222. Notch 222 is formed by the portions of predeposition layer 212 on opposing sides of etch mask 208 laterally and vertically diffusing and overlapping when driving the dopant into semiconductor substrate 12. Notch 222 arises because dopant is not deposited on the portion of surface 16 under or protected by doping mask 208.

In accordance with one embodiment, driving-in the impurity material of predeposition layers 210 and 212 thermally oxidizes surfaces 14 and 16 and forms oxide layers 230 and 232, respectively. Thermally oxidizing surfaces 14 and 16 typically reshapes doping mask 208. Alternatively, doping mask 208 and any oxide that may have formed on surfaces 14 and 16 may be removed and dielectric layers 230 and 232 may be formed on surfaces 14 and 16, respectively. Techniques for the alternative method of forming dielectric layers 230 and 232 include thermal oxidation, chemical vapor deposition, sputtering, etc. By way of example, dielectric layers 230 and 232 are oxide.

Figure 12:
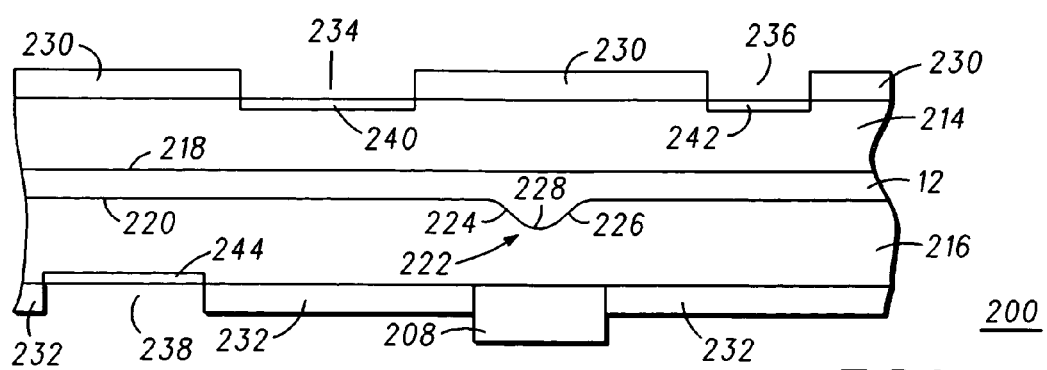
FIG. 12 is a cross-sectional side view of the thyristor of FIG. 11 at a later stage of manufacture.

Referring now to FIG. 12, dielectric layer 230 is patterned to have openings 234 and 236, and dielectric layer 232 is patterned to have an opening 238. An impurity material of P-type conductivity is deposited on the portions of surfaces 14 and 16 exposed by opening 234, 236, and 238 to form predeposition layers 240, 242, and 244, respectively. By way of example, the impurity material is boron and is deposited to have a resistivity ranging from approximately 0.3 $\Omega$/square to approximately 2 $\Omega$/square. Suitable sources of boron include boron trichloride, diborane, or the like.

Figure 13:
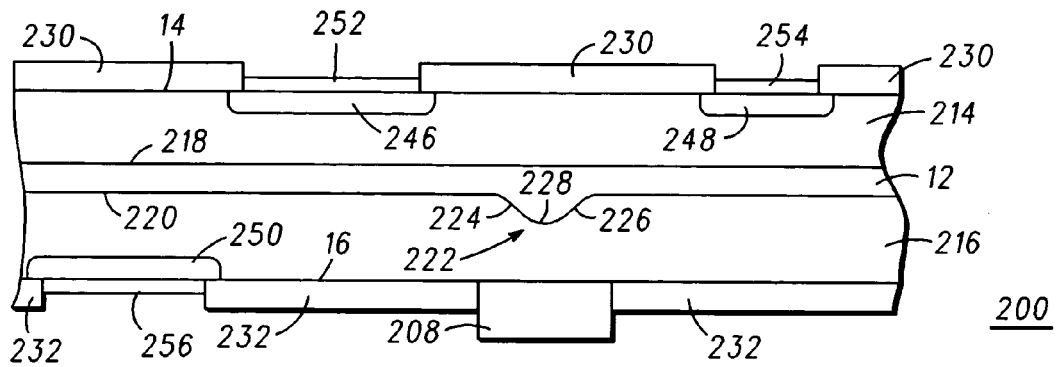
FIG. 13 is a cross-sectional side view of the thyristor of FIG. 12 at a later stage of manufacture.

Referring now to FIG. 13, the impurity material disposed on the exposed portions of surfaces 14 and 16 is driven into semiconductor substrate 12 to form doped regions 246, 248, and 250. The drive-in is performed for a time ranging from approximately 2 hours to approximately 6 hours at a temperature ranging from approximately 1,200° C. to approximately 1,270° C. Doped regions 246 and 248 extend from surface 14 into semiconductor substrate 12 and doped region 250 extends from surface 16 into semiconductor substrate 12. Doped region 246 serves as a cathode region of thyristor 10 and doped region 248 serves as a gate region of thyristor 10. In accordance with one embodiment, driving-in the impurity material of predeposition layers 240, 242, and 244 thermally oxidizes surfaces 14 and 16 and forms oxide layers 252 and 254 from surface 14 and oxide layer 256 from surface 16.

Figure 14:
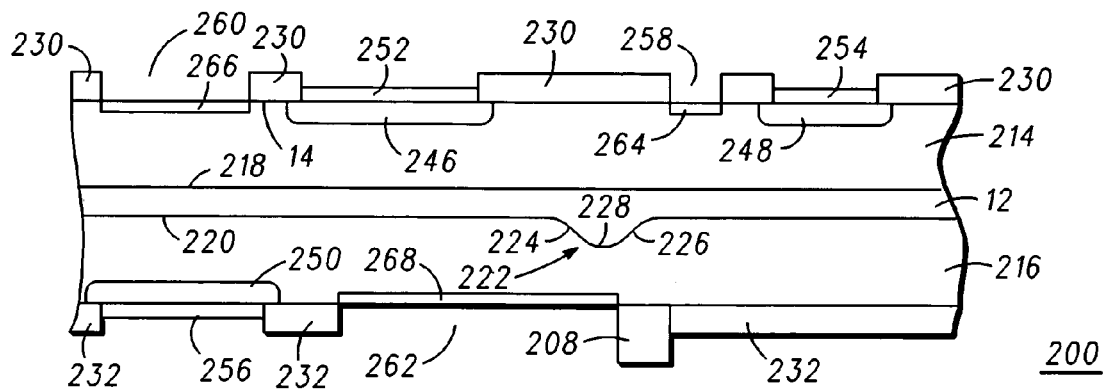
FIG. 14 is a cross-sectional side view of the thyristor of FIG. 13 at a later stage of manufacture.

Referring now to FIG. 14, a portion of dielectric layer 230 between doped region 248 and doped region 246 is removed to form an opening 258 and a portion of dielectric layer 230 above doped region 250 is removed to form an opening 260. Openings 258 and 260 expose portions of surface 14.

Doping mask 208 and portions of dielectric material 232 adjacent doping mask 208 are removed to form an opening 262 that exposes surface 16. An impurity material of N-type conductivity is deposited on the portions of surfaces 14 and 16 exposed by openings 258, 260, and 262 to form predeposition layers 264, 266, and 268, respectively. By way of example, the impurity material is phosphorus or a phosphorus containing material that is deposited to have a resistivity ranging from approximately 0.3 Ω/square to approximately 2 Ω/square. Suitable sources of phosphorus include phosphorus oxytrichloride ($POCl_3$), phosphine ($PH_3$), phosphorus penta-oxide, or the like.

Figure 15:
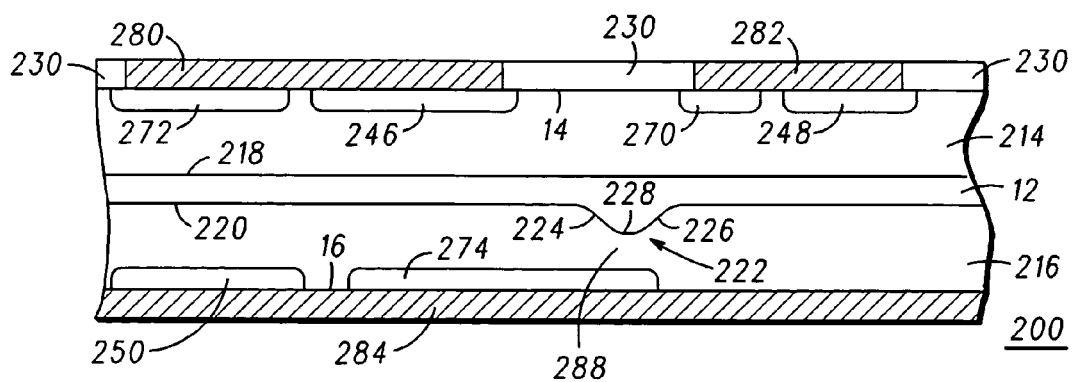
FIG. 15 is a cross-sectional side view of the thyristor of FIG. 14 at a later stage of manufacture.

Referring now to FIG. 15, the impurity material disposed on the exposed portions of surfaces 14 and 16 is driven into semiconductor substrate 12 to form doped regions 270, 272, and 274, wherein doped region 274 is laterally spaced apart from doped region 250. The drive-in is performed for a time ranging from approximately 2 hours to approximately 6 hours at a temperature ranging from approximately 1,200° C. to approximately 1,270° C. Doped regions 270 and 272 extend from surface 14 into semiconductor substrate 12 and doped region 274 extends from surface 16 into semiconductor substrate 12. Oxide layers 252 and 254 and a portion of dielectric layer 230 over doped regions 246, 272, 248, and 270 are removed from surface 14. Oxide layer 232 is removed from surface 16.

Electrical contacts are made to doped regions 246, 272, 248, 270, 250, and 274. More particularly, a top cathode contact 280 is formed in contact with doped regions 246 and 272, a gate contact 282 is formed in contact with doped regions 248 and 270, and a bottom cathode contact 284 is formed in contact with bottom doped regions 250 and 274. Techniques for forming openings in dielectric material and forming electrical contacts are known to those skilled in the art. An advantage of thyristor 200 is that it provides a means to localize highly sensitive triggering spots. For example, notch 222 is vertically adjacent doped region 274 and cooperates with doped region 274 to form a gain-enhanced site or region 288. Region 288 locally boosts the gain of the NPN transistor formed between doped regions 12, 216, and 274. Another advantage of triac 200 is that it improves trigger current balancing by design rather than by diffusion processing. As a consequence of the improved design, diffusion processing can be adjusted to provide a triac with a superior dynamic performance, namely, a triac having a higher stability against fast varying voltage signals. In addition, structures in accordance with the present invention can be used to manufacture triacs capable of operating in the third quadrant (gate negative, or negative logic applications) and in the fourth quadrant (positive or negative logic applications).

Figure 16:
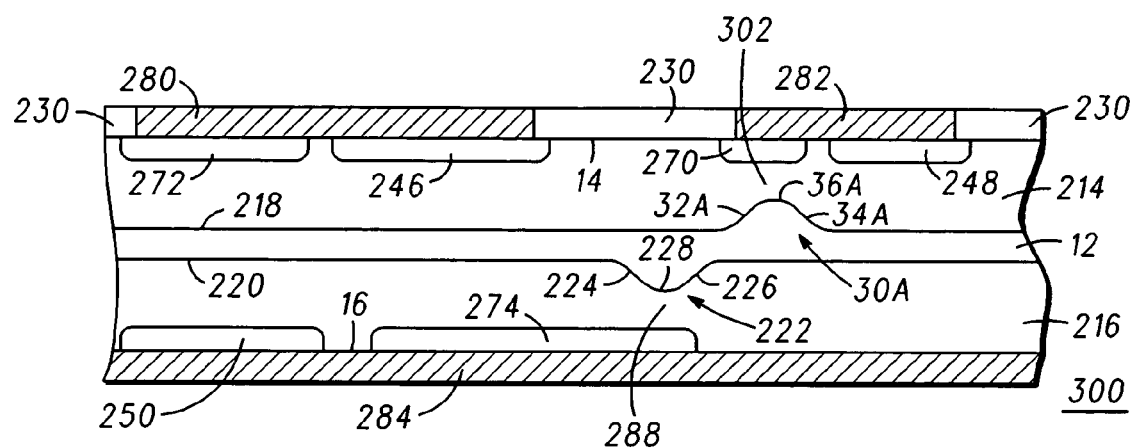
FIG. 16 is a cross-sectional side view of a thyristor during manufacture in accordance with yet another embodiment of the present invention.

Referring now to FIG. 16, is a cross-sectional side view of a thyristor 300 in accordance with another embodiment of the present invention. Thyristor 300 is similar to thyristor 200, except that it further includes a doped region that has a notch similar to that of thyristor 10. Accordingly, the reference characters of the features similar to those of thyristor 200 have been preserved. The letter A has been appended to reference characters 30, 32, 34, and 36 to identify the notch in thyristor 300 that is analogous to notch 30 of thyristor 10. Thus, thyristor 300 has a notch 30A having lateral boundaries 32A and 34A and a vertical boundary 36A. An advantage of thyristor 300 is that it provides another means to localize highly sensitive triggering spots. For example, notch 30A is vertically adjacent doped region 270 and cooperates with doped region 270 to form a gain-enhanced site or region 302. Region 302 locally boosts the gain of the NPN transistor formed between doped regions 12, 214, and 270. Another advantage of triac 300 is that has improved trigger current balancing and a lower triggering current when operating in all quadrants and especially in quadrants 2 and 3 (gate negative).

Figure 17:
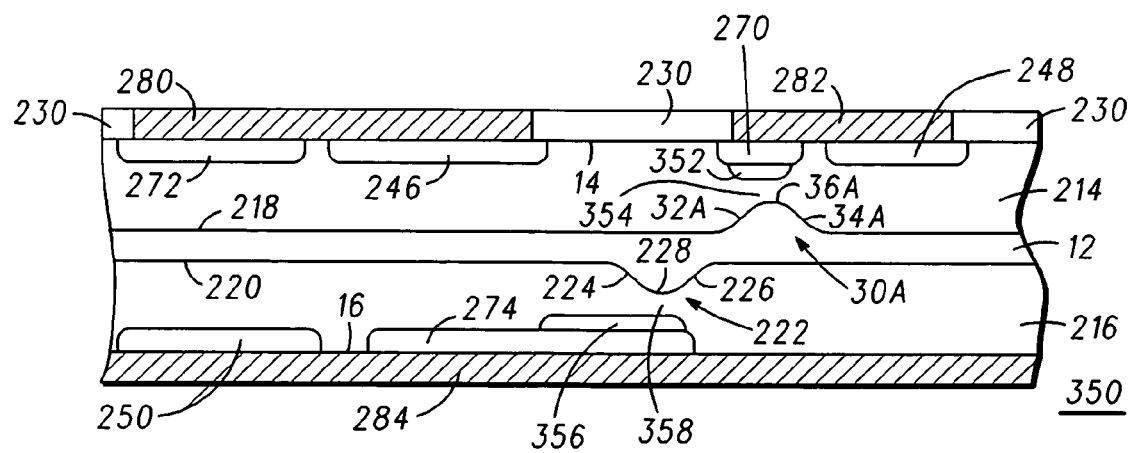
FIG. 17 is a cross-sectional side view of a thyristor during manufacture in accordance with yet another embodiment of the present invention.

FIG. 17 is a cross-sectional side view of a thyristor 350 in accordance with another embodiment of the present invention. Thyristor 350 is similar to thyristor 300 except that it includes an extension region 352 of N-type conductivity extending from doped region 270 into doped region 214. Thus, notch 30A cooperates with doped region 270 and extension region 352 to form a gain-enhanced site or region 354 that locally boosts the gain of the NPN transistor formed from substrate 12, doped regions 214 and 270, and extension region 352. In addition, an extension region 356 of N-type conductivity extends from doped region 174 into doped region 216 creating a gain-enhanced site 358 in doped region 216 that locally boosts the gain of the NPN transistor formed from substrate 12, doped regions 216 and 274, and extension region 356.

Although certain preferred embodiments and methods have been disclosed herein, it will be apparent from the foregoing disclosure to those skilled in the art that variations and modifications of such embodiments and methods may be made without departing from the spirit and scope of the invention. For example, doped extension regions can be formed from any of the doped regions to for gain-enhanced sites. It is intended that the invention shall be limited only to the extent required by the appended claims and the rules and principles of applicable law.

What is claimed is:

1. A thyristor, comprising:
   a semiconductor substrate of a first conductivity type having first and second surfaces;
   a first doped region of a second conductivity type extending from the first surface into the semiconductor substrate, the first doped region having a vertical boundary in the semiconductor substrate, wherein a portion of the vertical boundary has a first notch; and
   a second doped region of the first conductivity type extending from the first surface into the first doped region.

2. The thyristor of claim 1, further including a third doped region of the second conductivity type extending from the second surface into the semiconductor substrate, the third doped region having a vertical boundary.

3. The thyristor of claim 2, further including a fourth doped region of the first conductivity extending from the second surface into the third doped region.

4. The thyristor of claim 3, further including a fifth doped region of the first conductivity type extending from the first surface into the first doped region, the fifth doped region laterally spaced apart from the second doped region.

5. The thyristor of claim 4, wherein the portion of the vertical boundary of the first doped region that has the first notch is vertically adjacent the second doped region and wherein the first notch and the second doped region cooperate to form a gain enhancement region in the first doped region.

6. The thyristor of claim 4, wherein the portion of the vertical boundary of the first doped region that has the first notch is vertically adjacent the fifth doped region and wherein the first notch and the fifth doped region cooperate to form a gain enhancement region in the first doped region.

7. The thyristor of claim 3, further including a fifth doped region of the first conductivity type extending from the second surface into the third doped region, the fifth doped region laterally spaced apart from the fourth doped region.

8. The thyristor of claim 7, wherein the portion of the vertical boundary of the first doped region that has the first notch is vertically adjacent the second doped region and wherein the first notch and the second doped region cooperate to form a gain enhancement region in the first doped region.

9. The thyristor of claim 7, further including a sixth doped region of the first conductivity type extending from the first surface into the semiconductor substrate, wherein the portion of the vertical boundary of the first doped region that has the first notch is vertically adjacent the sixth doped region and wherein the first notch and the sixth doped region cooperate to form a gain enhancement region in the first doped region.

10. The thyristor of claim 4, further including a doped extension region of the first conductivity type extending from the second doped region into the first doped region.

11. The thyristor of claim 4, wherein the doped extension region of the first conductivity type is adjacent the portion of the vertical boundary of the first doped region that has the first notch.

12. The thyristor of claim 4, further including a doped extension region of the first conductivity type extending from the fifth doped region.

13. The thyristor of claim 12, wherein the doped extension region of the first conductivity type is adjacent the portion of the vertical boundary of the first doped region that has the first notch.

14. The thyristor of claim 3, wherein a portion of the vertical boundary of the third doped region has a second notch.

15. The thyristor of claim 14, wherein the portion of the vertical boundary of the third doped region that has the second notch is vertically adjacent the fourth doped region and wherein the second notch and the fourth doped region cooperate to form a gain enhancement region in the second doped region.

16. The thyristor of claim 15, further including a doped extension region of the first conductivity type extending from the fourth doped region into the third doped region.

17. The thyristor of claim 16, wherein the notch in the vertical boundary of the third doped region is adjacent the doped extension region of the first conductivity type extending from the fourth doped region.

18. The thyristor of claim 4, further including:
 a sixth doped region of the second conductivity type extending from the first surface into the first doped region; and
 a seventh doped region of the second conductivity type extending from the first surface into the first doped region.

19. The thyristor of claim 18, further including an eighth doped region of the first conductivity type extending from the second surface into the third doped region.

20. A method for manufacturing a thyristor, comprising:
 providing a semiconductor substrate of a first conductivity type, the semiconductor substrate having first and second surfaces;
 forming a first doped region of a second conductivity type in the semiconductor substrate, the first doped region extending from the first surface into the semiconductor substrate and having a vertical boundary in the semiconductor substrate, wherein a portion of the vertical boundary has a notch; and
 forming a second doped region of the first conductivity type in the semiconductor substrate, the second doped region extending from the first surface into the first doped region.

21. The method of claim 20, further including forming a third doped region of the second conductivity type in the semiconductor substrate, the third doped region extending from the second surface into the semiconductor substrate and having a vertical boundary in the semiconductor substrate.

22. The method of claim 21, wherein forming the third doped region includes forming the third doped region to have a notch in a portion of the vertical boundary.

* * * * *